(12) United States Patent
Issa et al.

(10) Patent No.: US 11,955,980 B2
(45) Date of Patent: Apr. 9, 2024

(54) ELECTRONIC APPARATUS AND METHOD FOR REDUCING COARSE LOCK TIME OF PHASE LOCKED LOOP (PLL)

(71) Applicant: Samsung Electronics Co., Ltd., Suwon-si (KR)

(72) Inventors: Venkatasuryam Setty Issa, Bengaluru (IN); Subba Reddy Siddamurthy, Bengaluru (IN); Aswani Aditya Kumar Tadinada, Bengaluru (IN); Vasu Bevara, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 17 days.

(21) Appl. No.: 17/838,923

(22) Filed: Jun. 13, 2022

(65) Prior Publication Data

US 2023/0275588 A1   Aug. 31, 2023

(30) Foreign Application Priority Data

Feb. 25, 2022   (IN) .............................. 202241010331

(51) Int. Cl.
 *H03D 3/24*  (2006.01)
 *H03L 7/099*  (2006.01)
 *H03L 7/107*  (2006.01)

(52) U.S. Cl.
 CPC .......... *H03L 7/1075* (2013.01); *H03L 7/0995* (2013.01)

(58) Field of Classification Search
 CPC ..... H03L 7/1075; H03L 7/0995; H03L 7/099; H03L 7/103; G09G 3/3677
 USPC ......................................... 375/373–376, 327
 See application file for complete search history.

(56) References Cited

U.S. PATENT DOCUMENTS

| 4,758,801 | A | 7/1988 | Draxelmayr | |
|---|---|---|---|---|
| 7,898,343 | B1 | 3/2011 | Janesch | |
| 2005/0264330 | A1* | 12/2005 | Li | H03L 7/103 327/156 |
| 2011/0304407 | A1* | 12/2011 | Chiang | H03L 7/099 331/182 |
| 2017/0148392 | A1* | 5/2017 | Kim | G09G 3/3677 |

FOREIGN PATENT DOCUMENTS

WO   WO-2006-110907 A2   10/2006

OTHER PUBLICATIONS

Ron Kapusta, et al. "A 14b 80 MS/s SAR ADC With 73.6 dB SNDR in 65 nm CMOS" IEEE Jounral of Solid-State Circuits, vol. 48, No. 12, pp. 3059-3066 (2013).

* cited by examiner

*Primary Examiner* — Phuong Phu
(74) *Attorney, Agent, or Firm* — HARNESS, DICKEY & PIERCE, P.L.C.

(57) ABSTRACT

Some example embodiments herein disclose an electronic apparatus and method for reducing or minimizing coarse lock time of Phase Locked Loop (PLL). The method includes controlling a voltage transient in the ABC current DAC of the PLL using the plurality of switchable voltage clamps, where the ABC current DAC includes a plurality of MOSFETs. Further, the method includes dividing the loop filter capacitor of the PLL into two segments to reduce the LPF settling time. Further, the method includes minimizing or reducing the coarse lock time of the PLL using the controlled voltage transients and the divided loop filter capacitor.

13 Claims, 7 Drawing Sheets

ELECTRONIC APPARATUS AND METHOD FOR REDUCING COARSE LOCK TIME OF PHASE LOCKED LOOP (PLL)

CROSS-REFERENCE TO RELATED APPLICATIONS

This U.S. non-provisional patent application claims priority under 35 U.S.C. § 119 to Indian Patent Application No. 202241010331, filed on Feb. 25, 2022, in the Indian Patent Office, the entire contents of which are hereby incorporated by reference).

BACKGROUND

Some example embodiments relate to wireless communication, and more specifically related to an electronic apparatus and/or a method for minimizing or reducing a coarse lock time of Phase Locked Loop (PLL).

In general, clock recovery, frequency, phase modulation, and frequency synthesizer are among applications of a Phase Locked Loop (PLL). As part of a central design element, the PLL includes a phase-frequency detector, a charge pump, a low pass filter, a feedback divider/controller, a code generator, and either a voltage-controlled oscillator (VCO) or a current-controlled oscillator (CCO) with an accompanying voltage-to-current (V2I) converter. The oscillator produces an output frequency proportional to the oscillator's input voltage (in the case of a VCO) or current (in the case of a CCO).

The frequency synthesizer generates a variety of discrete output signals, each with a unique frequency. The various frequencies produced by the frequency synthesizer are defined throughout a frequency range. As a result, the frequency synthesizer may be used to select a desired frequency or target frequency from a set of frequencies defined across a reasonably broad frequency range, where each frequency can be selected by an appropriate coarse code(s) during a selection procedure.

Where the frequency synthesizer may first select a corresponding coarse code that determines the frequency from among the set of frequencies that captures (or is closest to) the target frequency when instructed (or controlled) to generate an output signal with the target frequency. Then, the frequency synthesizer locks the target frequency within the determined frequency. However, a significant issue is noticed when the frequency synthesizer selects/changes coarse code(s). When the coarse code(s) changes (for example, from 32 to 48), a settling time/coarse lock time to lock the target frequency rises, which reduces overall system performance. Thus, it is desired to provide a useful alternative for minimizing or reducing the coarse lock time of the PLL.

SUMMARY

Some example embodiments herein minimize or reduce a coarse lock time of a PLL by controlling voltage transients (e.g. at least one of a drain voltage, a source voltage, a gate voltage, etc.) in an Automatic Bank Calibration (ABC) current Digital to Analog Converter (DAC) and minimizing or reducing a Low Pass Filter (LPF) settling time. The voltage transients are controlled by a plurality of switchable voltage clamps. The LPF settling time is reduced or minimized by dividing a loop filter capacitor of the PLL into two segments. A first segment is pre-charged to the supply voltage through a pull-up switch and a second segment is pre-charged to a ground voltage through a pull-down switch.

Accordingly, some embodiments herein disclose a Phase Locked Loop (PLL) for minimizing or reducing a coarse lock time. The PLL includes a plurality of switchable voltage clamps configured to control voltage transients in an Automatic Bank Calibration (ABC) current Digital to Analog Converter (DAC), where the ABC current DAC includes a plurality of Metal Oxide Silicon Field Effect Transistors (MOSFETs) and configured to provide a bias current to a ring Current Controlled Oscillator (CCO) that is configured to generate a ring oscillator frequency, a segmented loop filter capacitor configured to minimize or reduce a Low Pass Filter (LPF) settling time, a bias generator configured to generate a bias voltage to the plurality of MOSFETs and a bias current to the ABC current DAC, where the bias generator comprises an Operational Transconductance Amplifier (OTA), and a code generator (e.g. the ABC current DAC) that is configured to generate an ABC codes, where the ABC codes are generated based on a difference between the ring oscillator frequency and a target frequency to achieve coarse lock.

In some example embodiments, the plurality of switchable voltage clamps are configured to be added to one of a first 4-Most Significant Bits (MSB) of the ABC current DAC and an ABC current mirror DAC branch, and where the plurality of switchable voltage clamps are MOSFETs.

In some example embodiments, the voltage transients include at least one of a drain voltage, a source voltage, and a gate voltage of MOSFET in the ABC current mirror DAC branch.

In some example embodiments, the plurality of switchable voltage clamps is configured to control the voltage transients in the ABC current DAC by receiving the ABC code(s), determining whether an ABC current mirror DAC branch(s) is turned on based on the received ABC code(s), perform one of, providing an alternate current path for the ABC current mirror DAC branch by maintaining the drain voltage of the ABC current mirror DAC branch close to a CCO node voltage (e.g. CCO ring supply voltage (VCCO) node) instead of a supply voltage in response to determining that the ABC current mirror DAC branch is turned off, or supplying a low voltage drop to the ABC current mirror DAC branch(s) to the VCCO node to reduce perturbation of the gate voltage of the ABC current mirror DAC branch(s) in response to determining that the ABC current mirror DAC branch(s) is turned on.

In some example embodiments, the loop filter capacitor is configured for minimizing or reducing the LPF settling time includes dividing the loop filter capacitor of the PLL into two segments, where a first segment is pre-charged to the supply voltage through a pull-up switch and a second segment is pre-charged to a ground voltage through a pull-down switch when the PLL is turned off, determine whether the PLL is turn on, perform one of, shorting the first segment and the second segment to minimize or reduce the LPF settling time in response to determining that the PLL is turn on, where the pull-up switch and the pull-down switch are turned off, or separating the first segment and the second segment to minimize or reduce the LPF settling time in response to determining that the PLL is turned off.

Accordingly, some example embodiments herein disclose a method for minimizing or reducing the coarse lock time of the PLL. The method includes controlling, by the PLL, the voltage transient in the ABC current DAC of the PLL using the plurality of switchable voltage clamps, where the ABC current DAC includes the plurality of MOSFETs. Further, the method includes dividing, by the PLL, the loop filter capacitor of the PLL into two segments to minimize or reduce the LPF settling time, and minimizing or reducing, by the PLL, the coarse lock time of the PLL using the controlled voltage transients and the divided loop filter capacitor.

These and other aspects of various example embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of example embodiments herein, and example embodiments herein include all such modifications.

BRIEF DESCRIPTION OF FIGURES

This invention is illustrated in the accompanying drawings, throughout which like reference letters indicate corresponding parts in the various figures. Example embodiments herein will be better understood from the following description with reference to the drawings, in which.

DETAILED DESCRIPTION OF SOME EXAMPLE EMBODIMENTS

Figure 1A:
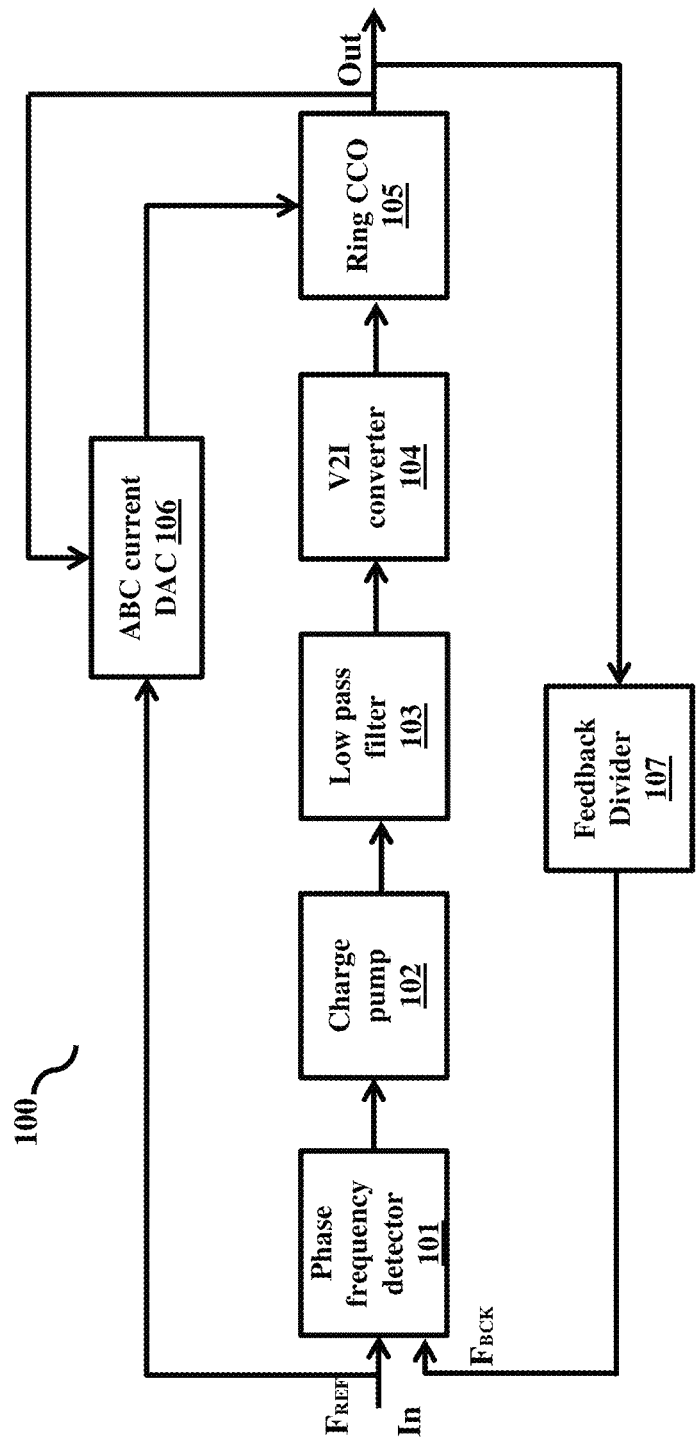
FIG. 1A is an example illustration of a current-controlled oscillator (CCO) based Phase Locked Loop (PLL) with an Automatic Bank Calibration (ABC) current Digital to Analog Converter (DAC), according to prior art.

Various example embodiments herein and/or various features and advantageous details thereof are explained more fully with reference to non-limiting example embodiments that are illustrated in the accompanying drawings and detailed in the following description. Descriptions of some, such as some well-known components and/or processing techniques are omitted so as to not unnecessarily obscure various example embodiments herein. Also, various example embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which various embodiments herein can be practiced and to further enable those of ordinary skill in the art to practice various embodiments herein. Accordingly, various examples should not be construed as limiting the scope of example embodiments herein.

Various example embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits, and/or the like, and may optionally be driven by firmware. The circuits may, for example, be embodied in one or more semiconductor chips, and/or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of example embodiments may be physically separated into two or more interacting and discrete blocks without departing from the scope of the invention. Likewise, the blocks of various embodiments may be physically combined into more complex blocks without departing from the scope of the invention The accompanying drawings are used to help easily understand various technical features and it should be understood that various embodiments presented herein are not limited by the accompanying drawings. As such, detailed descriptions of various example embodiments should be construed to extend to any alterations, equivalents, and substitutes in addition to those which are particularly set out in the accompanying drawings. Although the terms first, second, etc. may be used herein to describe various elements, these elements should not be limited by these terms. These terms are generally only used to distinguish one element from another.

Throughout this disclosure, the terms "PLL" and "frequency synthesizer" may be used interchangeably and may mean the same. Throughout this disclosure, the terms "CCO" and "ring CCO" may be used interchangeably and may mean the same.

FIG. 1A is an example illustration of an existing current-controlled oscillator (CCO) based Phase Locked Loop (PLL) (100) with an Automatic Bank Calibration (ABC) current Digital to Analog Converter (DAC), according to prior art.

The PLL (100) includes a phase-frequency detector (101), a charge pump (102), a low pass filter (103), a Voltage to Current (V2I) converter (104), a ring CCO (105) (i.e. current-controlled CCO), an ABC current DAC (106), and a feedback divider (107) (e.g. frequency divider).

The phase-frequency detector (101) has an input frequency ($F_{REF}$) coupled to a feedback signal $F_{BCK}$ provided by the feedback divider (107). The outputs of the phase frequency detector (101) are provided to the programmable charge pump (102). An output of the charge pump (102) is coupled to the loop filter (103), which provides a fine-tuning voltage (e.g. $V_{tune}$) to the V2I converter (104). The V2I converter (104) provides a fine-tuning current (e.g. $I_{tune}$) to the ring CCO (105). The output of the ring CCO (105) is provided to the feedback divider (107). The ring CCO (105) precisely generates an output signal having a target frequency. For example, the PLL (100) is used to "lock" the target frequency of the desired output signal generated by the ring CCO (105) with a feedback loop, e.g. the feedback divider (107), to provide the output signal with a highly stable frequency.

Furthermore, the PLL (100) includes the ABC current DAC (106) (e.g. analog auto-calibration apparatus) that provides a coarse tuning current for providing coarse adjustments to a frequency pivot point of the oscillator frequency of the ring CCO (105). A pivot current, received from the ABC current DAC (106), is added to the fine-tuning current, and the combined current controls the ring CCO (105). The ABC current DAC (106) is designed with a calibratable and automatically adjustable coarse-tune pivot point. The fine tune is implemented by a fine-tune voltage-to-current (i.e. V2I converter) to adjust the pivot point for the oscillation frequency of the ring CCO (105). The V2I converter (104) is coupled to the loop filter (103).

In general, tuning the PLL (100) comprises two main stages: an initial coarse-tuning stage followed by a fine-tuning stage. The coarse tuning stage consists of/includes determining and applying a suitable/desired coarse code to the ring CCO (105) to pick a matching intermediate frequency (or say desired intermediate frequency/band). the fine-tuning stage consists of/includes the PLL feedback loop (e.g. using the feedback divider (107)) to the ring CCO (105), such that the PLL (100) further adjusts the intermediate oscillation frequency until it becomes phase synchronous with the target frequency.

A variety of ways can be used to determine the desired coarse code. One such method employs one or more binary tree searches to choose the desired coarse code from a set of possible coarse codes respectively associated with a plurality of intermediate frequencies. For example, the PLL (100) may receive information indicating the target frequency and determine the desired coarse code that is most suited to the target frequency. For example, the desired intermediate frequency band may be chosen because the band includes the target frequency or is the closest to the target frequency, and so on. The desired coarse code chosen may then be applied to circuitry such as the ABC current DAC (106), which controls the coarse tuning of the ring CCO (105). The coarse tuning stage may include generating a frequency, comparing the generated frequency to the desired intermediate frequency indicated by the selected/desired coarse code, and then iteratively adjusting (increasing and/or decreasing) the generated frequency until the generated frequency substantially equals the desired intermediate frequency. Ultimately, the desired coarse code is determined by the ABC current DAC (106) that controls the selection of the desired intermediate frequency during the coarse tuning stage. Where or when the ABC current DAC (106) includes a current sources a sequence of frequency comparisons may be used to select/de-select respective current sources to control the generation of the desired intermediate frequency.

Figure 1B:
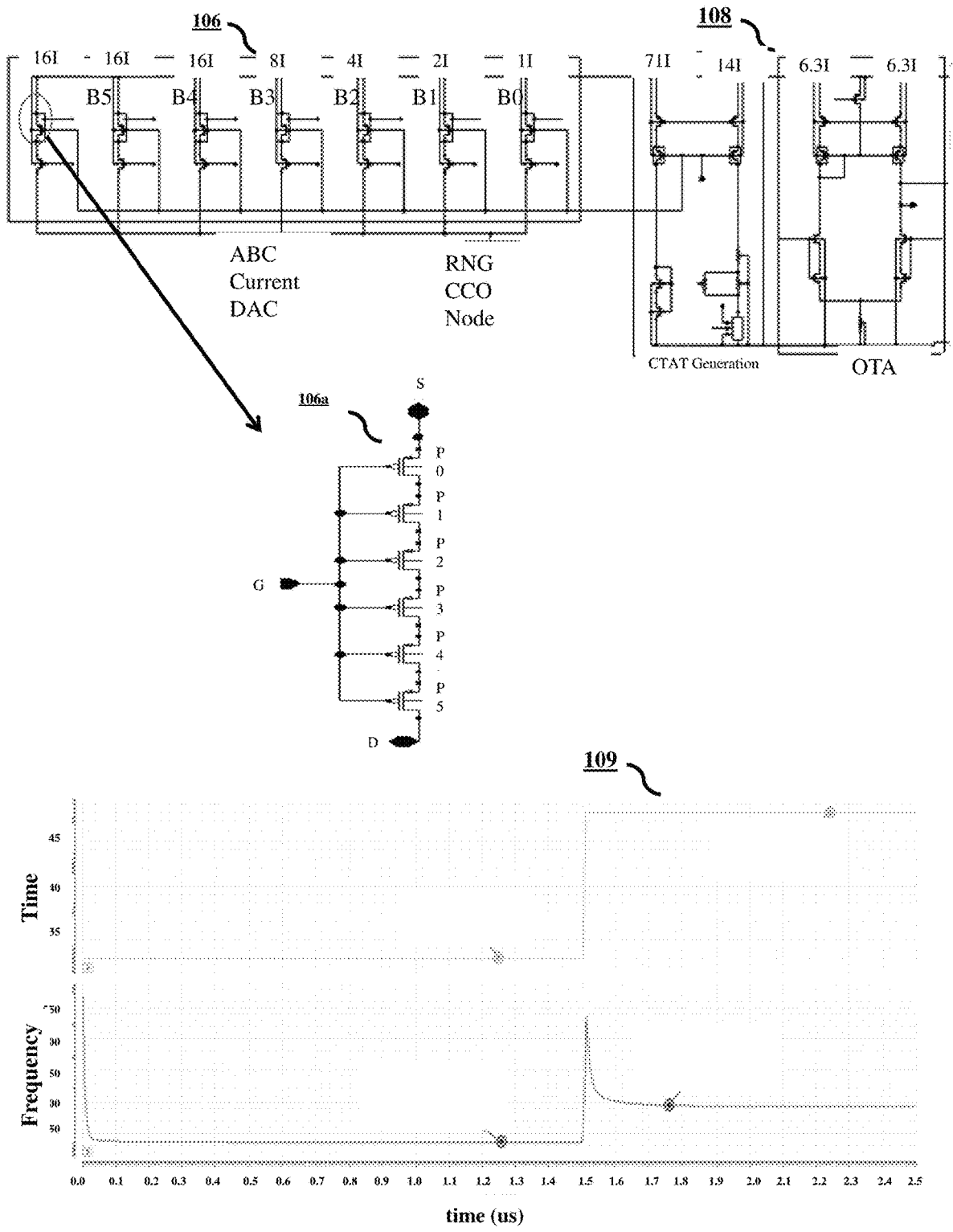
FIG. 1B illustrates a problem in the existing CCO based PLL with the ABC current DAC, according to prior art.

FIG. 1B illustrates a problem in the existing CCO-based PLL (100) with the ABC current DAC (106), according to prior art.

For example, consider the ABC current DAC (106), which contains 6-bits (B5-B0) for feeding a bias current to the ring CCO (105). To eliminate or reduce switching ripple and increase linearity of the ABC current DAC, the first 2-bits (e.g. most-significant bits) are thermometer coded/unary coded while the remaining 4-bits are binary coded (106). In addition, the ABC current DAC (106) gets a bias voltage from a bias generating block (108), and each ABC current mirror DAC branch (B5-B0) is linked to the ring CCO (105) through switches (e.g. capacitor switches, Metal Oxide Silicon Field Effect Transistors (MOSFETs), etc.) controlled by ABC bits/codes (or selected/desired coarse code). To generate a frequency using the ring CCO (105), one ABC code is applied to the ABC current DAC (106) at a time. The PLL (100) compares the generated frequency to the desired intermediate frequency indicated by the selected/desired coarse code and then adjusts the generated frequency iteratively (increasing and/or decreasing the ABC code) until the generated frequency substantially equals the desired intermediate frequency.

For a 32-bit ABC code, for example, the corresponding ABC current mirror DAC branch (e.g. MSB bit (B5)) of the ABC current DAC (106) is activated. As a result, the voltage drop across "ON" switches is very small (e.g., less than 5 mV), and a drain node voltage of the ABC current mirror DAC branch approaches to a CCO node voltage of the ring CCO (105). The other ABC current mirror DAC branch (i.e. B4-B0) is switched off, and a drain node voltage of the other ABC current mirror DAC branch approaches a supply voltage.

Consider a case in which the ABC code is changed from 32-bits to 48-bits (109). The ABC current DAC (106) associated ABC current mirror DAC branch (i.e. (B4)) is activated. The drain node voltage of the ABC current mirror DAC branch (B4) changes from the supply voltage to the CCO node voltage, and this voltage shift upsets the B4's gate node voltage owing to parasitic coupling capacitance from drain to gate (e.g. commonly called Cgd), which requires a certain amount of time to return to the gate voltage. As a result, when the coarse code(s) change (for example, from 32 to 48), the settling time/coarse lock time (the initial coarse-tuning stage) to lock the target frequency increases, reducing overall system performance.

Certain existing method/system uses a high-speed Operational Transconductance Amplifier (OTA) in the bias generating block (108) to reduce the settling time of the current mirror gate node. The high-speed OTA needs a large amount of current. Because the ABC current DAC (106) delivers current to the ring CCO (105), to reduce a phase noise of the ring CCO (105), the existing method/system necessitates the use of extremely large area MOSFETs (6 stacked devices) (106a) in the ABC current DAC (106). And hence in the bias generating block (108) which creates the bias voltage for the ABC current DAC (106). As a result, the existing method/system needs to increase the current and the OTA area (e.g. area increase up to ~40% of OTA+DAC area) to achieve faster code-switching time, which is not suggestible for any electronic device.

Accordingly, various example embodiments herein disclose a Phase Locked Loop (PLL) for minimizing or reducing a coarse lock time. The PLL includes a plurality of switchable voltage clamps for controlling voltage transients in an Automatic Bank Calibration (ABC) current Digital to Analog Converter (DAC), where the ABC current DAC includes a plurality of Metal Oxide Silicon Field Effect Transistors (MOSFETs) and providing a bias current to a ring Current Controlled Oscillator (CCO) for generating a ring oscillator frequency, a segmented loop filter capacitor for minimizing or reducing a Low Pass Filter (LPF) settling time, a bias generator for sending a bias voltage to the plurality of MOSFETs and a bias current to the ABC current DAC, where the bias generator comprises an Operational Transconductance Amplifier (OTA), and a code generator for generating an ABC code(s), where the ABC code(s) generates based on a difference between the ring oscillator frequency and a target frequency to achieve coarse lock.

Accordingly, some example embodiments herein disclose a method for minimizing or reducing the coarse lock time of the PLL. The method includes controlling, by the PLL, the voltage transient in the ABC current DAC of the PLL using the plurality of switchable voltage clamps, where the ABC current DAC includes the plurality of MOSFETs. Further, the method includes dividing, by the PLL, the loop filter capacitor of the PLL into two segments to minimize or reduce the LPF settling time, and minimizing or reducing, by the PLL, the coarse lock time of the PLL using the controlled voltage transients and the divided loop filter capacitor.

Unlike existing methods and systems, the proposed method allows the PLL to minimize or reduce the coarse lock time of the PLL by controlling the voltage transients (e.g. a drain voltage, a source voltage, a gate voltage, etc.) in the ABC current DAC and minimizing or reducing the LPF settling time. The voltage transients are controlled by the plurality of switchable voltage clamps. The LPF settling time is minimized or reduced by dividing the loop filter capacitor of the PLL into two segments. A first segment is pre-charged to the supply voltage through a pull-up switch and a second segment is pre-charged to a ground voltage through a pull-down switch.

Referring now to the drawings, and more particularly to FIGS. 2 through 6B, where similar reference characters denote corresponding features consistently throughout the figures, there are shown preferred embodiments.

Figure 2:
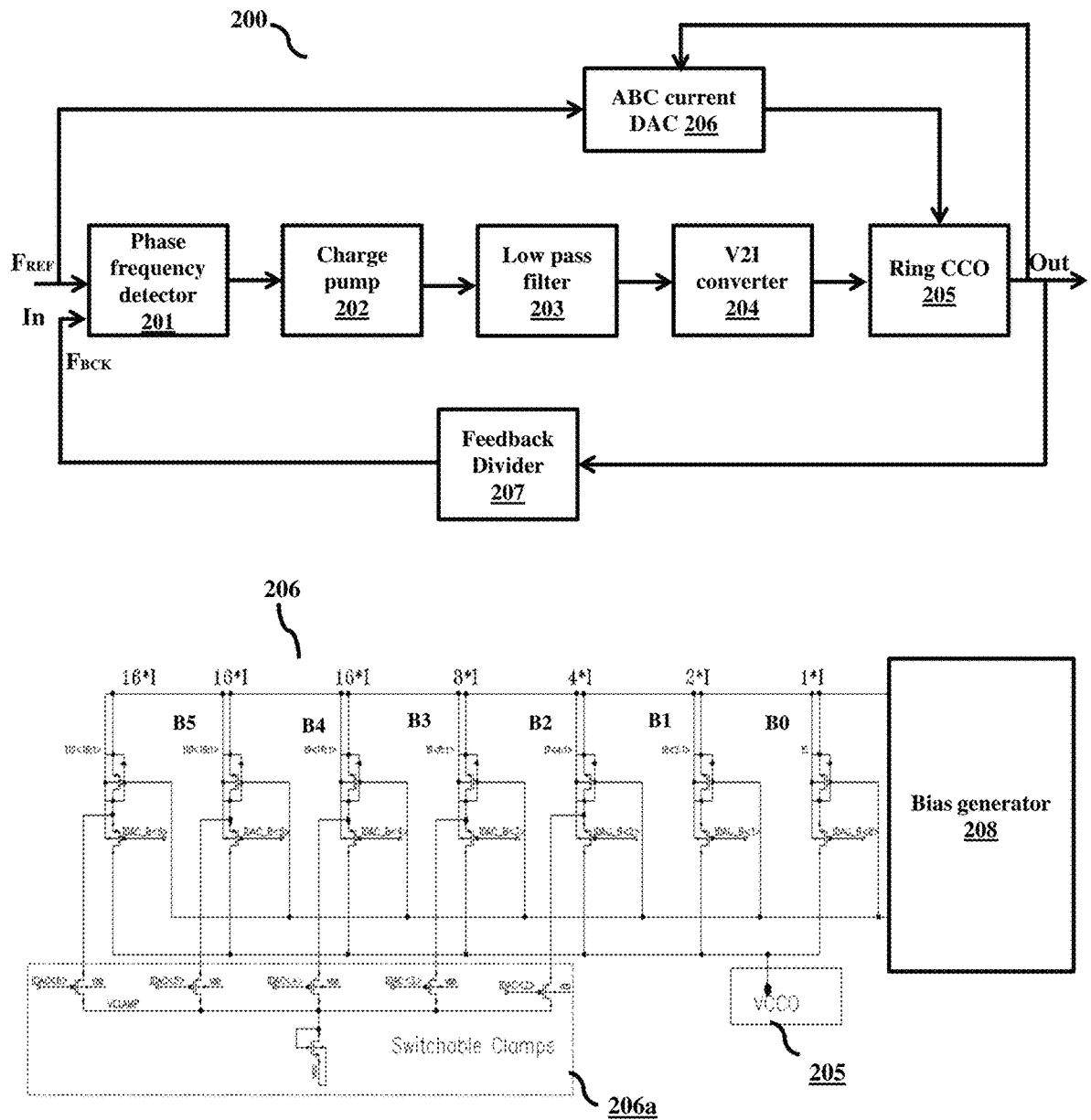
FIG. 2 illustrates a proposed CCO based PLL with the ABC current DAC to minimize or reduce a coarse lock time of the PLL, according to some example embodiments as disclosed herein.

FIG. 2 illustrates a proposed CCO-based PLL with the ABC current DAC to minimize or reduce a coarse lock time of the PLL, according to some example embodiments as disclosed herein.

The PLL (200) includes a phase-frequency detector (201), a charge pump (202), a low pass filter (203), a V2I converter (204), a ring CCO (205) (i.e. current-controlled CCO), an ABC current DAC (206), and a feedback divider (207) (e.g. frequency divider).

The phase-frequency detector (201) has an input frequency ($F_{REF}$) coupled to a feedback signal $F_{BCK}$ (provided by the feedback divider (207). The outputs of the phase frequency detector (201) are provided to the programmable charge pump (202). An output of the charge pump (202) is coupled to the loop filter (203), which provides a fine-tuning voltage (e.g. $V_{tune}$) to the V2I converter (204). The V2I converter (204) provides a fine-tuning current (e.g. $I_{tune}$) to the ring CCO (205). The output of the ring CCO (205) is provided to the feedback divider (207). The ring CCO (205) precisely generates an output signal having a target frequency. For example, the PLL (200) is used to "lock" the target frequency of the desired output signal generated by the ring CCO (205) with a feedback loop (i.e. feedback divider (207)) to provide the output signal with a highly stable frequency. Furthermore, the PLL (200) includes the ABC current DAC (206) that provides a coarse tuning current for providing coarse adjustments to a frequency pivot point of the oscillator frequency of the ring CCO (205).

In some example embodiments, the ABC current DAC (206) includes a plurality of switchable voltage clamps (206a) for controlling voltage transients (e.g. at least one of a drain voltage, a source voltage, and a gate voltage) in the ABC current DAC (206), where the ABC current DAC (206) includes a plurality of Metal Oxide Silicon Field Effect Transistors (MOSFETs) (or say current sources). For example, the plurality of switchable voltage clamps (206a) consists of or include switches that can connect and/or disconnect the plurality of switchable voltage clamps from the drain of the ABC current mirror DAC branch. The plurality of switchable voltage clamps may be or include simple diodes that are connected to N-channel Metal Oxide Semiconductors (NMOS).

In some example embodiments, the plurality of switchable voltage clamps (206a) are added to one of a first 4-Most Significant Bits (MSB) of the ABC current DAC (206) and/or ABC current mirror DAC branch (or for all ABC current mirror DAC branches). The plurality of switchable voltage clamps (206a) may be more suitable for the MSB of the ABC current DAC (206) as the settling time/coarse lock time (the initial coarse-tuning stage) for Least Significant Bit (LSB) is already small (e.g. less than two reference cycle).

In some example embodiments, when the ABC current mirror DAC branches (e.g. B5-B0) are turned off, switchable voltage clamps (206a) offer an alternative current channel for the ABC current DAC (206) and therefore keep the drain voltage of mirror (e.g. MOSFETs) near to the CCO node voltage rather than the supply voltage. When the ABC current mirror DAC branches are turned on, the change in the drain voltage is low, resulting in less disturbance on the current mirror gate node and a faster settling time (e.g. less than two reference cycles). Once AFC operation is completed, switchable voltage clamps are disconnected from the drain of current mirrors irrespective of whether the drain is On/Off using standard gate logic. Accordingly, the switchable voltage clamps (206a) are designed to be active only during AFC calibration and hence consume current only during ABC calibration mode.

Figure 3A:
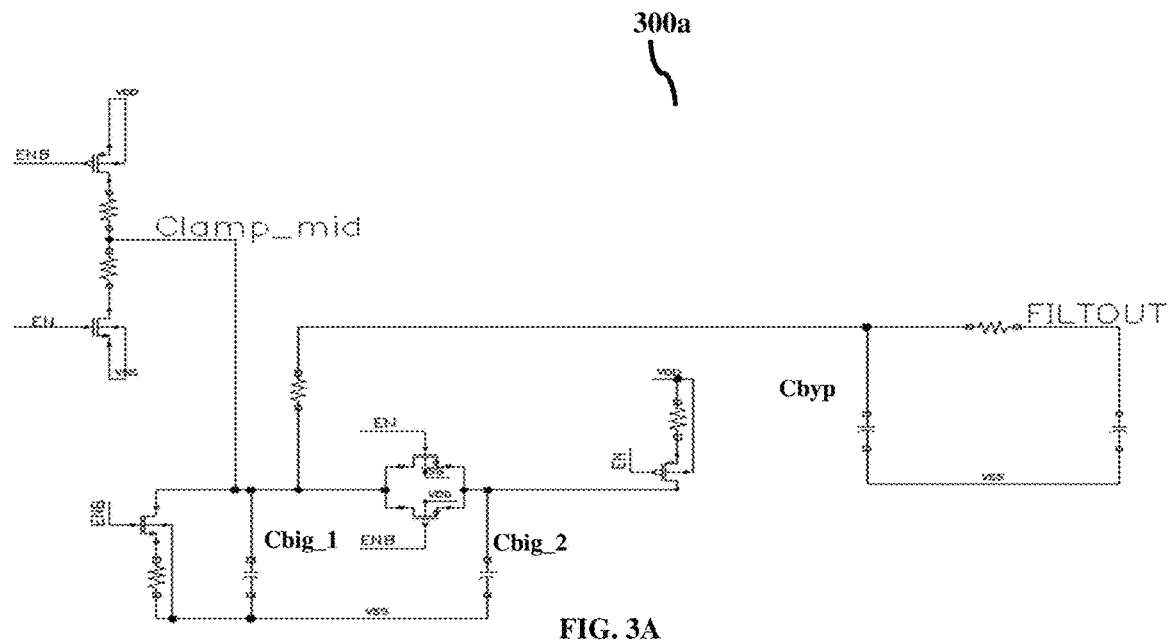
FIGS. 3A-3B illustrate apparatus to minimize or reduce a Low Pass Filter (LPF) settling time, according to some example embodiments as disclosed herein.
Figure 3B:
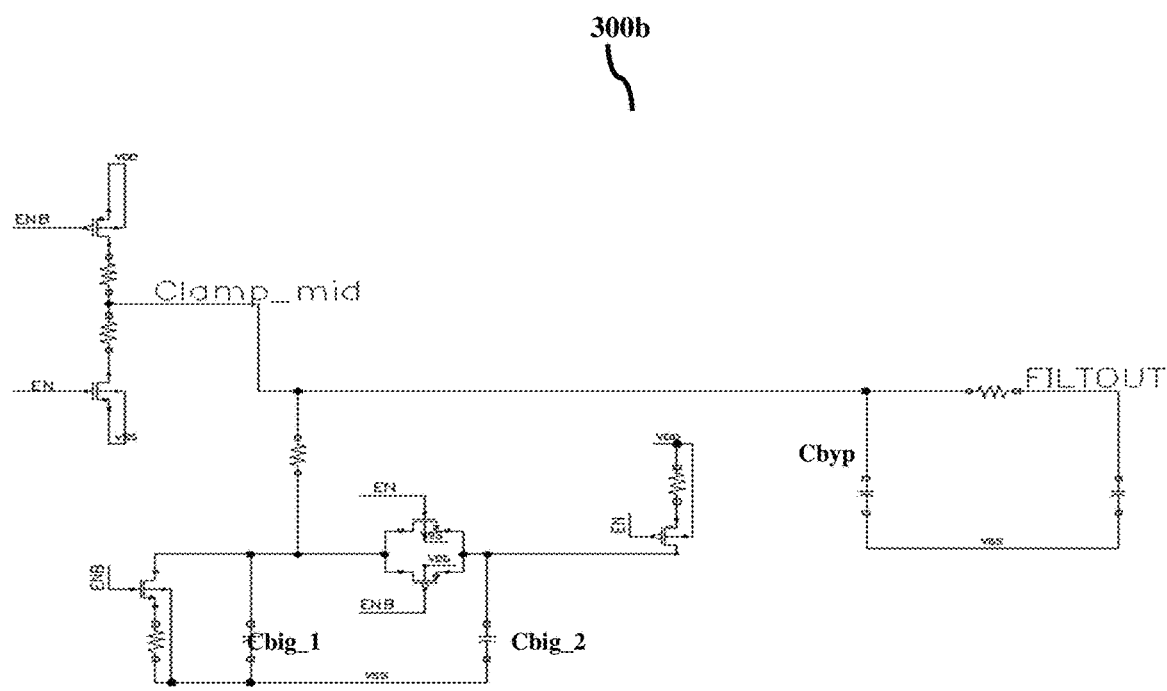

FIGS. 3A-3B illustrate apparatus to minimize or reduce a Low Pass Filter (LPF) settling time, according to some example embodiments as disclosed herein.

Refereeing to FIG. 3A, a loop filter capacitor is split into two segments (e.g. Cbig_1 and Cbig_2). One segment is pre-charged to the supply voltage (e.g. positive supply voltage "VDD") through a pull-up switch and the other segment is pre-charged to ground through a pull-down switch.

Refereeing to FIG. 3B, once the PLL (200) is turned on, shorting these two segments with switch and pull-up/pull-down switches are turned off. When the PLL (200) is off the switch between the two capacitor segments is also off. The ratio of capacitance between two capacitor segments is decided based on the net voltage when both segments are shorted is close to a clamp voltage.

Figure 4:
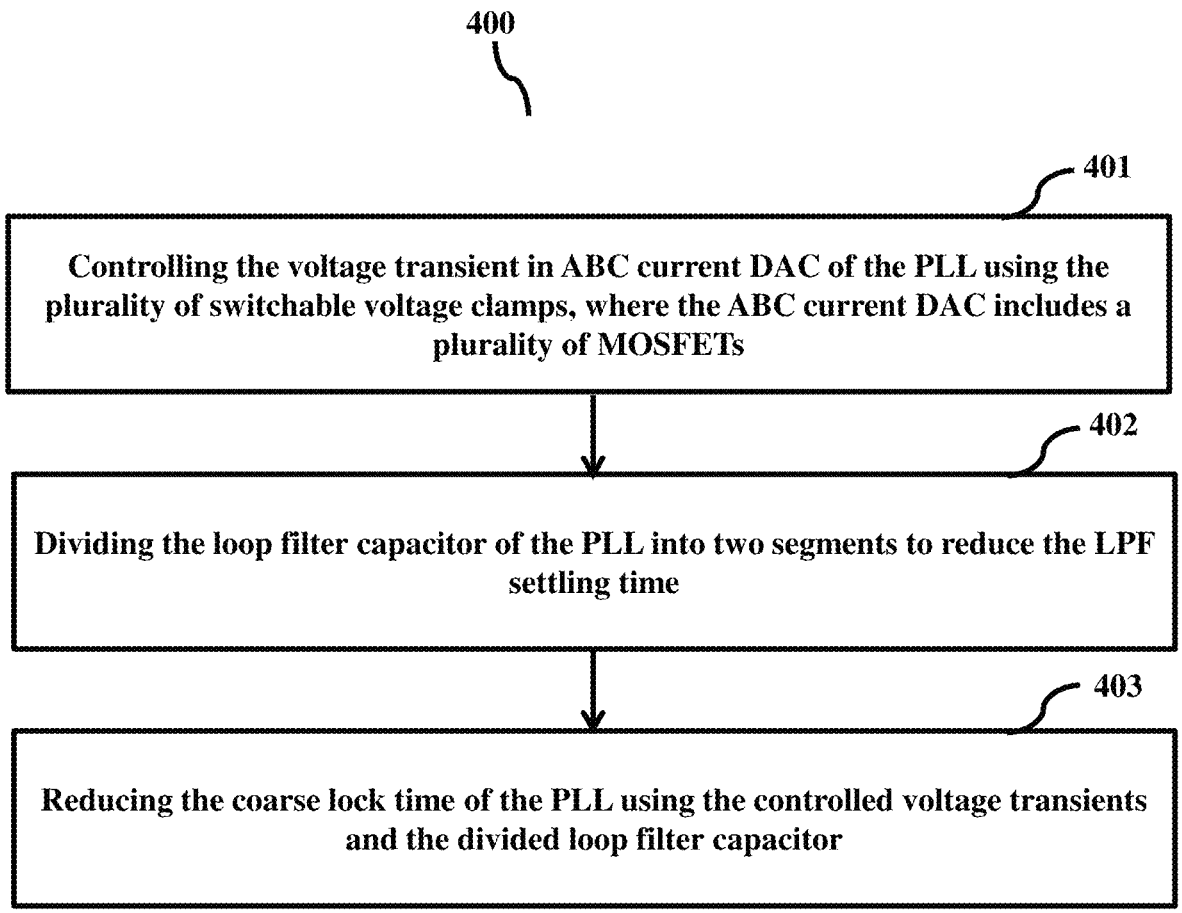
FIG. 4 is a flow diagram illustrating a method for minimizing or reducing the coarse lock time of the PLL, according to some example embodiments as disclosed herein.

FIG. 4 is a flow diagram (400) illustrating a method for minimizing or reducing the coarse lock time of the PLL (200), according to some example embodiments as disclosed herein. The PLL (200) performs steps (401-403) to minimize or reduce the coarse lock time.

At 401, the method includes controlling a voltage transient in the ABC current DAC (206) of the PLL (200) using the plurality of switchable voltage clamps (206a), where the ABC current DAC (206) includes a plurality of MOSFETs. At 402, the method includes dividing the loop filter capacitor of the PLL (200) into two segments to minimize or reduce the LPF settling time. At 403, the method includes minimizing or reducing the coarse lock time of the PLL (200) using the controlled voltage transients and the divided loop filter capacitor.

Figure 5:
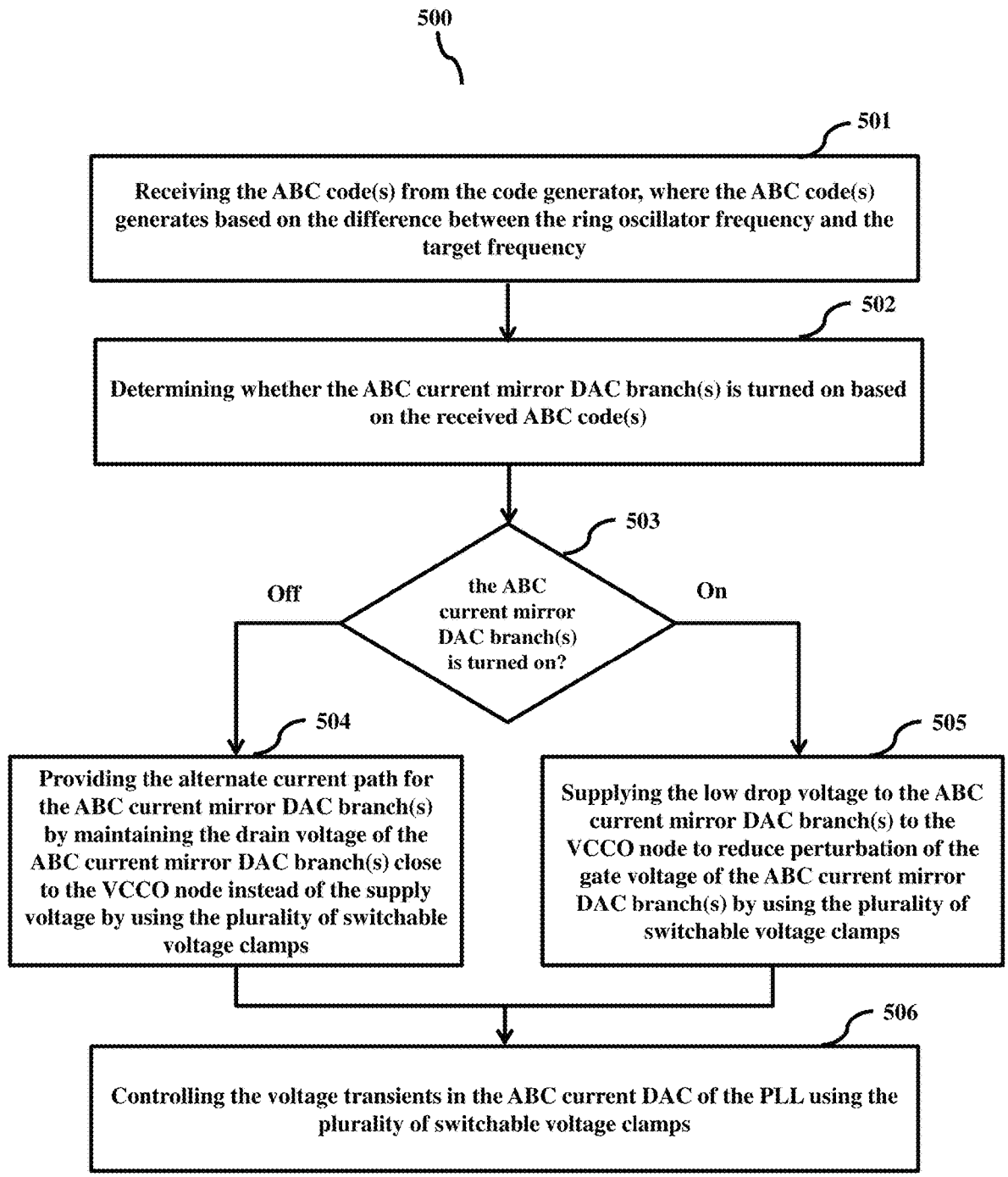
FIG. 5 is a flow diagram illustrating various operations for controlling a voltage transient in the ABC current DAC of the PLL using a plurality of switchable voltage clamps, according to some example embodiments as disclosed herein.

FIG. 5 is a flow diagram (500) illustrating various operations (and/or steps) for controlling the voltage transient in the ABC current DAC (206) of the PLL (200) using the plurality of switchable voltage clamps (206a), according to some example embodiments as disclosed herein. The PLL (200) performs steps (501-506).

At 501, the method includes receiving the ABC code(s) from the ABC current DAC (206) (or say code generator of the PLL (200)), where the ABC code generates based on the difference between the ring oscillator frequency and the target frequency. At 502-503, the method includes determining whether the ABC current mirror DAC branch(s) is turned on based on the received ABC code(s). At 504, the method includes providing the alternate current path for the ABC current mirror DAC branch(s) by maintaining the drain voltage of the ABC current mirror DAC branch(s) close to the VCCO node instead of the supply voltage by using the plurality of switchable voltage clamps (206*a*) in response to determining that the ABC current mirror DAC branch(s) is turned off. At 505, the method includes supplying the low drop voltage to the ABC current mirror DAC branch(s) to the VCCO node to reduce perturbation of the gate voltage of the ABC current mirror DAC branch(s) by using the plurality of switchable voltage clamps (206*a*) in response to determining that the ABC current mirror DAC branch(s) is turned on. At 506, the method includes controlling the voltage transients in the ABC current DAC (206) of the PLL (200) using the plurality of switchable voltage clamps (206*a*).

Figure 6:
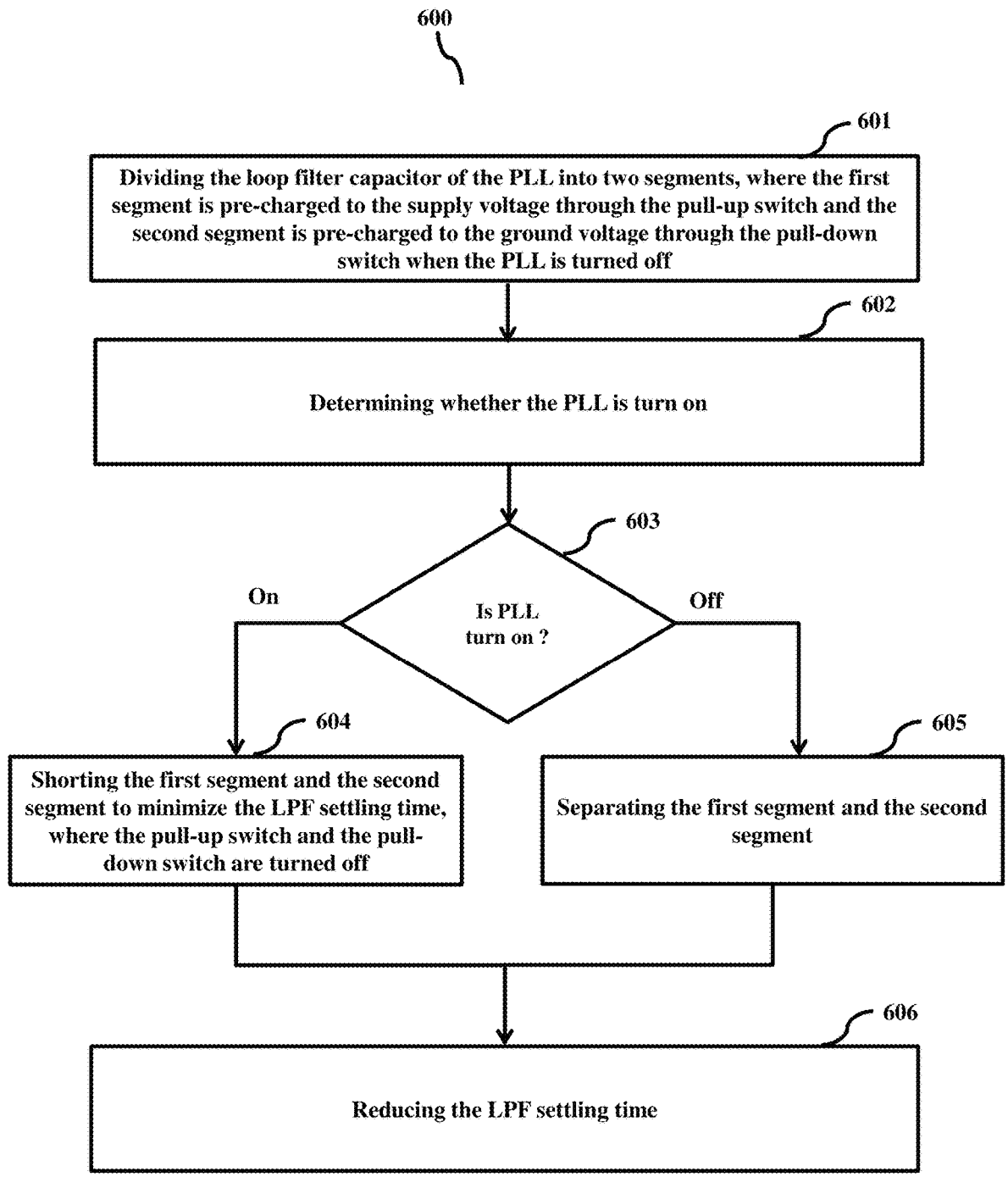
FIG. 6 is a flow diagram illustrating various operations for minimizing or reducing the LPF settling time, according to some example embodiments as disclosed herein.

FIG. 6 is a flow diagram (600) illustrating various operations (steps) for minimizing or reducing the LPF settling time, according to some example embodiments as disclosed herein. The PLL (200) performs steps (601-606).

At 601, the method includes dividing the loop filter capacitor of the PLL (200) into two segments, where the first segment is pre-charged to the supply voltage through the pull-up switch and the second segment is pre-charged to the ground voltage through the pull-down switch when the PLL (200) is turned off. At 602-603, the method includes determining whether the PLL (200) is turn on (e.g. ring CCO matches with the target frequency). At 604, the method includes shorting the first segment and the second segment to minimize or reduce the LPF settling time in response to determining that the PLL (200) is turn on, where the pull-up switch and the pull-down switch are turned off. At 605, the method includes separating the first segment and the second segment to minimize or reduce the LPF settling time in response to determining that the PLL (200) is turn off. At 606, the method includes minimizing or reducing the LPF settling time of the PLL (200).

The various actions, acts, blocks, steps, or the like in the flow diagram (400,500, and 600) may be performed in the order presented, in a different order, or simultaneously. Further, in some example embodiments, some of the actions, acts, blocks, steps, or the like may be omitted, added, modified, skipped, or the like without departing from the scope of the invention.

Example embodiments disclosed herein can be implemented using at least one hardware device and performing network management functions to control the elements.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The foregoing description of the specific embodiments will so fully reveal the general nature of example embodiments herein that others can, by applying current knowledge, readily modify and/or adapt for various applications such specific embodiments without departing from the generic concept, and, therefore, such adaptations and modifications should and are intended to be comprehended within the meaning and range of equivalents of various example embodiments. It is to be understood that the phraseology or terminology employed herein is for the purpose of description and not of limitation. Therefore, while example embodiments herein have been described in terms of preferred embodiments, those of ordinary skill in the art will recognize that example embodiments herein can be practiced with modification within the scope of example embodiments as described herein.

We claim:

1. A Phase Locked Loop (PLL) for reducing a coarse lock time, the PLL comprising:
a plurality of switchable voltage clamps configured to control voltage transients in an Automatic Bank Calibration (ABC) current Digital to Analog Converter (DAC), wherein the ABC current DAC comprises a plurality of Metal Oxide Silicon Field Effect Transistors (MOSFETs) and is configured to provide a bias current to a ring Current Controlled Oscillator (CCO) that is configured to generate a ring oscillator frequency;
a segmented loop filter capacitor configured to reduce a Low Pass Filter (LPF) settling time;
a bias generator configured to send a bias voltage to the plurality of MOSFETs and a bias current to the ABC current DAC, wherein the bias generator comprises an Operational Transconductance Amplifier (OTA); and
the ABC current DAC that is configured to generate at least one ABC code, wherein the at least one ABC code is generated based on a difference between the ring oscillator frequency and a target frequency to achieve coarse lock.

2. The PLL of claim 1, wherein the plurality of switchable voltage clamps is added to one of a first 4-Most Significant Bits (MSB) of the ABC current DAC and at least one ABC current mirror DAC branch, and wherein the plurality of switchable voltage clamps are MOSFETs.

3. The PLL of claim 1, wherein the voltage transients correspond to a drain voltage, a source voltage, and a gate voltage of a MOSFET at least one ABC current mirror DAC branch.

4. The PLL of claim 1, wherein the plurality of switchable voltage clamps is configured to the voltage transients in the ABC current DAC by:
receiving the at least one ABC code;
determining whether at least one ABC current mirror DAC branch is turned on based on the received at least one ABC code; and
perform one of,
providing an alternate current path for the at least one ABC current mirror DAC branch by maintaining a drain voltage of the at least one ABC current mirror DAC branch close to a CCO ring supply voltage (VCCO) node instead of a supply voltage in response to determining that the at least one ABC current mirror DAC branch is turned off, or supplying a low voltage drop to the at least one ABC current mirror DAC branch to the VCCO node to reduce perturbation of a gate voltage of the at least one ABC current mirror DAC branch in response to determining that the at least one ABC current mirror DAC branch is turned on.

5. The PLL of claim 1, wherein the PLL is configured to reduce the LPF settling time by:
dividing the loop filter capacitor of the PLL into two segments, wherein a first segment is pre-charged to a supply voltage through a pull-up switch and a second segment is pre-charged to a ground voltage through a pull-down switch in response to the PLL being turned off;
determining whether the PLL is turn on; and
performing one of,
shorting the first segment and the second segment to reduce the LPF settling time in response to determining that the PLL is turn on, wherein the pull-up switch and the pull-down switch are turned off, or
separating the first segment and the second segment to reduce the LPF settling time in response to determining that the PLL is turned off.

6. A method for reducing a coarse lock time of a Phase Locked Loop (PLL), the method comprising:
controlling, by the PLL, a voltage transient in an Automatic Bank Calibration (ABC) current Digital to Analog Converter (DAC) of the PLL using a plurality of switchable voltage clamps, wherein the ABC current DAC comprises a plurality of Metal Oxide Silicon Field Effect Transistors (MOSFETs) and the ABC current DAC is configured to generate at least one ABC code based on a difference between a ring oscillator frequency and a target frequency;
dividing, by the PLL, a loop filter capacitor of the PLL into two segments to reduce a Low Pass Filter (LPF) settling time; and
reducing, by the PLL, the coarse lock time of the PLL using the controlled voltage transients and the divided loop filter capacitor.

7. The method of claim 6, wherein the plurality of switchable voltage clamps are configured to be added to one of a first 4-Most Significant Bits (MSB) of the ABC current DAC and at least one ABC current mirror DAC branch, and wherein the plurality of switchable voltage clamps are MOSFETs.

8. The method of claim 6, wherein the voltage transients correspond to a drain voltage, a source voltage, and a gate voltage of a MOSFET in at least one ABC current mirror DAC branch.

9. The method of claim 6, wherein controlling, by the PLL, the voltage transients in the ABC current DAC of the PLL using the plurality of switchable voltage clamps comprises:
receiving, by the PLL, the at least one ABC code from the ABC current DAC;
determining, by the PLL, whether at least one ABC current mirror DAC branch is turned on based on the received at least one ABC code; and
performing, by the PLL, one of,
providing an alternate current path for the at least one ABC current mirror DAC branch by maintaining a drain voltage of the at least one ABC current mirror DAC branch close to a CCO ring supply voltage (VCCO) node instead of a supply voltage by using the plurality of switchable voltage clamps in response to determining that the at least one ABC current mirror DAC branch is turned off, or
supplying a low voltage drop to the at least one ABC current mirror DAC branch to the VCCO node to reduce perturbation of a gate voltage of the at least one ABC current mirror DAC branch by using the plurality of switchable voltage clamps in response to determining that the at least one ABC current mirror DAC branch is turned on.

10. The method of claim 6, wherein dividing, by the PLL, the loop filter capacitor of the PLL into two segments to reduce the LPF settling time comprises:
dividing, by the PLL, the loop filter capacitor of the PLL into two segments, wherein a first segment is pre-charged to a supply voltage through a pull-up switch and a second segment is pre-charged to a ground voltage through a pull-down switch when the PLL is turned off;
determining, by the PLL, whether the PLL is turn on; and
performing, by the PLL, one of:
shorting the first segment and the second segment to reduce the LPF settling time in response to determining that the PLL is turn on, wherein the pull-up switch and the pull-down switch are turned off, or
separating the first segment and the second segment to reduce the LPF settling time in response to determining that the PLL is turned off.

11. A method for reducing a coarse lock time of a Phase Locked Loop (PLL), the method comprising:
controlling, by the PLL, a voltage transient in an Automatic Bank Calibration (ABC) current Digital to Analog Converter (DAC) of the PLL using a plurality of switchable voltage clamps, wherein the ABC current DAC comprises a plurality of Metal Oxide Silicon Field Effect Transistors (MOSFETs);
dividing, by the PLL, a loop filter capacitor of the PLL into two segments to reduce a Low Pass Filter (LPF) settling time; and
reducing, by the PLL, the coarse lock time of the PLL using the controlled voltage transients and the divided loop filter capacitor,
wherein dividing, by the PLL, the loop filter capacitor of the PLL into two segments to reduce the LPF settling time includes
dividing, by the PLL, the loop filter capacitor of the PLL into two segments, wherein a first segment is pre-charged to a supply voltage through a pull-up switch and a second segment is pre-charged to a ground voltage through a pull-down switch when the PLL is turned off;
determining, by the PLL, whether the PLL is turn on; and
performing, by the PLL, one of:
shorting the first segment and the second segment to reduce the LPF settling time in response to determining that the PLL is turn on, wherein the pull-up switch and the pull-down switch are turned off, or
separating the first segment and the second segment to reduce the LPF settling time in response to determining that the PLL is turned off.

12. The method of claim 11, wherein the plurality of switchable voltage clamps are configured to be added to one of a first 4-Most Significant Bits (MSB) of the ABC current DAC and at least one ABC current mirror DAC branch, and wherein the plurality of switchable voltage clamps are MOSFETs.

13. The method of claim 11, wherein the voltage transients correspond to a drain voltage, a source voltage, and a gate voltage of a MOSFET in at least one ABC current mirror DAC branch.

* * * * *